United States Patent
Humfeld

(10) Patent No.: US 9,301,401 B2
(45) Date of Patent: Mar. 29, 2016

(54) NANOTUBE ELECTRONICS TEMPLATED SELF-ASSEMBLY

(71) Applicant: The Boeing Company, Chicago, IL (US)

(72) Inventor: Keith Daniel Humfeld, Federal Way, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/819,972

(22) Filed: Aug. 6, 2015

(65) Prior Publication Data

US 2015/0342059 A1    Nov. 26, 2015

Related U.S. Application Data

(62) Division of application No. 13/897,480, filed on May 20, 2013, now Pat. No. 9,117,883, which is a division of application No. 12/874,319, filed on Sep. 2, 2010, now Pat. No. 8,450,202.

(60) Provisional application No. 61/258,375, filed on Nov. 5, 2009.

(51) Int. Cl.
 *H05K 3/22*  (2006.01)
 *H01L 23/532*  (2006.01)

(52) U.S. Cl.
 CPC .......... *H05K 3/222* (2013.01); *H01L 23/53276* (2013.01)

(58) Field of Classification Search
 CPC ............. H05K 3/222; H01L 21/76838; H01L 23/53276
 USPC ...................... 257/746; 438/610; 118/612, 58
 See application file for complete search history.

(56) References Cited

U.S. PATENT DOCUMENTS

| | | | |
|---|---|---|---|
| 6,870,361 B2 * | 3/2005 | Chopra | B82Y 15/00 257/798 |
| 8,450,202 B1 | 5/2013 | Humfeld | |
| 9,117,883 B2 | 8/2015 | Humfeld | |
| 2006/0281306 A1 * | 12/2006 | Gstrein | H01L 21/76877 438/666 |
| 2007/0278448 A1 | 12/2007 | Chari et al. | |

(Continued)

FOREIGN PATENT DOCUMENTS

DE    102006048537 A1    4/2008

OTHER PUBLICATIONS

Makaram et al., "Scalable nanotemplate assisted directed assembly of single walled carbon nanotubes for nanoscale devices," Applied Physics Letters, vol. 90, No. 243108, Jun. 2007, 3 pages.

(Continued)

*Primary Examiner* — Walter H Swanson
(74) *Attorney, Agent, or Firm* — Yee & Associates, P.C.

(57) ABSTRACT

A fabricated substrate has at least one plurality of posts. The plurality is fabricated such that the two posts are located at a predetermined distance from one another. The substrate is exposed to a fluid matrix containing functionalized carbon nanotubes. The functionalized carbon nanotubes preferentially adhere to the plurality of posts rather than the remainder of the substrate. A connection between posts of the at least one plurality of posts is induced by adhering one end of the functionalized nanotube to one post and a second end of the functionalized carbon nanotube to a second post.

19 Claims, 5 Drawing Sheets

(56) References Cited

U.S. PATENT DOCUMENTS

| | | | |
|---|---|---|---|
| 2009/0239338 A1* | 9/2009 | Zhou | B82Y 10/00 438/108 |
| 2011/0057717 A1 | 3/2011 | Manning et al. | |
| 2011/0156109 A1 | 6/2011 | Gazit et al. | |
| 2011/0180427 A1 | 7/2011 | Matsumoto et al. | |
| 2013/0264711 A1 | 10/2013 | Humfeld | |

OTHER PUBLICATIONS

Wei et al., "Directed Assembly of Polymer Blends Using Nanopatterned Templates," Advanced Materials, vol. 21, No. 7, Feb. 2009, pp. 794-798.

Xiong et al., "Building Highly Organized Single-Walled-Carbon-Nanotube Networks Using Template-Guided Fluidic Assembly," Small, vol. 3, No. 12, Dec. 2007, pp. 2006-2010.

Xiong et al., "Directed assembly of gold nanoparticle nanowires and networks for nanodevices," Applied Physics Letters, vol. 91, No. 063101, Aug. 2007, 3 pages.

Office Action, dated Sep. 25, 2012, regarding U.S. Appl. No. 12/874,319, 14 pages.

Notice of Allowance, dated Jan. 30, 2013, regarding U.S. Appl. No. 12/874,319, 8 pages.

Office Action, dated Feb. 21, 2014, regarding U.S. Appl. No. 13/897,480, 18 pages.

Final Office Action, dated Mar. 24, 2014, regarding U.S. Appl. No. 13/897,480, 19 pages.

Office Action, dated Jul. 7, 2014, regarding U.S. Appl. No. 13/897,480, 19 pages.

Notice of Allowance, dated Apr. 21, 2015, regarding U.S. Appl. No. 13/897,480, 11 pages.

* cited by examiner

NANOTUBE ELECTRONICS TEMPLATED SELF-ASSEMBLY

CROSS-REFERENCE TO RELATED APPLICATIONS

This application is a divisional of, and claims the benefit of priority of, U.S. patent application Ser. No. 13/897,480, filed May 20, 2013; which is a divisional of, and claims the benefit of priority of, U.S. patent application Ser. No. 12/874,319, filed Sep. 2, 2010; all of which are related to, and claim the benefit of priority of, provisional U.S. patent application Ser. No. 61/258,375, filed Nov. 5, 2009, entitled "Nanotube Electronics Templated Self-Assembly"; all of the aforementioned applications are incorporated herein by reference.

BACKGROUND INFORMATION

1. Field

The present disclosure relates generally to methods and systems for production of electronic devices, and devices produced therefrom. More specifically, the present disclosure relates to methods and systems for production of circuits containing nanotubes.

2. Background

Modern processor chip designs often include one or more caches on the same integrated circuit chip as the processor, and in some cases include multiple processors on a single integrated circuit chip. Despite the enormous improvement in speed obtained from integrated circuitry, the demand for even faster computer systems has continued. With this demand comes a need for even further size reduction in the logic circuitry within an integrated circuit chip.

A typical integrated circuit chip is constructed in multiple layers. Many active and passive elements are formed on a substrate (usually silicon). A dielectric layer is placed over the elements, and multiple conductive layers, each separated by another dielectric layer, are formed over the elements. The conductive layers carry power and ground potentials, as well as numerous signal interconnects running among active elements. Each conductive layer comprises multiple discrete conductors, often running substantially in parallel. Conductive interconnects between conductive layers, or between a conductive layer and an active or passive element, are formed as holes in the dielectric layers, called vias, into which a conductive metal, such as aluminum or copper, is introduced.

The number of active elements in a typical processor dictates a very large number of interconnections, and since these must be packaged within a small area, the size of individual interconnections is limited. Conductors, whether in the conductive layer or the via between conductive layers, have a small, finite resistance, which grows as the cross-sectional area of the conductor shrinks. Increasing the number of logic elements on a chip requires a larger number of conductors, which in turn reduces the amount of space available for each individual conductor. If all other design parameters remain the same, this has the effect of increasing the resistances of the individual conductors.

Recently, carbon nanotubes have been used to form conductive pathways in integrated circuits. Carbon nanotubes are cylindrically structured carbon allotropes composed entirely of $sp^2$-hybridized bonding between carbon atoms. A single walled carbon nanotube is conceptually a one-atom-thick layer of graphene wrapped into a seamless cylinder.

Manufacturing of carbon nanotube-based electronics requires the positioning of each individual nanotube, which is prohibitive in terms of time and cost. While carbon nanotube-based electronics can be fabricated, individual nanotubes must be directly placed to create the carbon nanotube-based electronics. The direct placement of nanotubes requires an atomic force microscopy tip or similar microscope tip to position each of the nanotubes to form each electrical connection. The required time and cost of manually positioning each of the nanotubes to form each electrical connection is prohibitive of production scale manufacturing of carbon nanotube-based electronics.

Therefore, it would be advantageous to have a method and apparatus that takes into account at least one of the issues discussed above, as well as possibly other issues.

SUMMARY

An embodiment of the present disclosure provides methods and systems for production of nanotube-enabled circuits that do not rely on manual positioning of the nanotubes. Carbon nanotubes self-assemble on a metal-templated surface to form electrical connections including semiconducting connections that define a circuit.

A fabricated substrate has at least one plurality of posts. The plurality is fabricated such that the centers of two posts are located at a predetermined distance from one another.

Due to the available bond sites on the carbon atoms along the end of a nanotube, or due to the increased energy of the carbon bonds when stretched under curvature in two dimensions, functional groups preferentially adhere to distal ends of the carbon nanotube. The relative concentration of functional groups at the distal ends of functionalized carbon nanotubes creates a concentration of electrical charges.

The substrate is exposed to a fluid matrix containing functionalized carbon nanotubes. The ends of the functionalized carbon nanotubes preferentially adhere to the plurality of posts rather than the remainder of the substrate. A connection between posts of the at least one plurality of posts is induced by adhering a second end of the functionalized carbon nanotube to a second one of the at least one plurality of posts.

The lengths and chiralities of the functionalized carbon nanotubes are preselected. The length of the functionalized carbon nanotubes matches the predetermined distance between the centers of posts of the plurality of posts. The chirality of the functionalized carbon nanotubes is selected to impart the desired electrical properties to the created circuit.

Carbon nanotubes are cylindrically structured carbon allotropes composed entirely of $sp^2$-hybridized bonding between carbon atoms. The chirality of the carbon nanotubes is denoted by a pair of indices (n, m). The values of n and m determine the chirality, or "twist" of the nanotube. The chirality, in turn, affects the conductance of the nanotube, its density, its lattice structure, and other properties. For a given (n, m) nanotube, if n=m, that is, the carbon nanotube has an "armchair" chirality, the carbon nanotube is conducting. If n−m is a multiple of three, then the nanotube is semiconducting with zero band gap such that the nanotube is considered semi-metallic. Otherwise, the nanotube is a moderate semiconductor. The band gap of a semiconducting carbon nanotube is determined uniquely by the chiral indices (n, m).

An embodiment of the present disclosure provides a method for assembling carbon nanotube electronics. A substrate is fabricated, wherein the substrate has at least one plurality of posts, the at least one plurality of posts being fabricated at a predetermined distance from one another. The substrate is then exposed to a fluid matrix containing functionalized carbon nanotubes. A first end of the functionalized carbon nanotube adheres to a first one of the at least one plurality of posts. A second end of the functionalized carbon nanotube adheres to a second one of the at least one plurality of posts, wherein a connection is formed between posts of the at least one plurality of posts.

An embodiment of the present disclosure provides a system for assembling carbon nanotube electronics. The system comprises a substrate, wherein the substrate has at least one plurality of posts, the at least one plurality of posts being fabricated at a predetermined distance from one another. The system also comprises a fluid matrix containing functionalized carbon nanotubes, wherein the substrate is exposed to the fluid matrix. Agitation of the fluid matrix adheres a first end of at least one of the functionalized carbon nanotubes to a first one of the at least one plurality of posts, and induces a connection between posts of the at least one plurality of posts by adhering a second end of the at least one of the functionalized carbon nanotube, to a second one of the at least one plurality of posts.

The features, functions, and advantages can be achieved independently in various embodiments of the present disclosure, or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

The different advantageous embodiments provide a method and system for production of nanotube-enabled circuits that do not rely on manual positioning of the nanotubes. Carbon nanotubes self-assemble on a metallic templated surface to form electrical connections. These electrical connections include, for example, without limitation, semiconducting connections that define a circuit.

A substrate has at least one plurality of posts. The plurality of posts is fabricated such that the center of two posts are located at a predetermined distance from one another.

Other pluralities of posts might be fabricated at other predetermined distances.

The substrate is exposed to a fluid matrix containing functionalized carbon nanotubes. The ends of the functionalized carbon nanotubes preferentially adhere to the plurality of posts rather than the remainder of the substrate. A connection between posts of the at least one plurality of posts is induced by adhering a second end of the functionalized carbon nanotube to a second one of the at least one plurality of posts.

The lengths and chiralities of the functionalized carbon nanotubes are preselected. The length of the functionalized carbon nanotubes matches the predetermined distance between the centers of the posts of the plurality of posts. The chirality of the functionalized carbon nanotubes is selected to impart the desired electrical properties to the created circuit.

Figure 1:
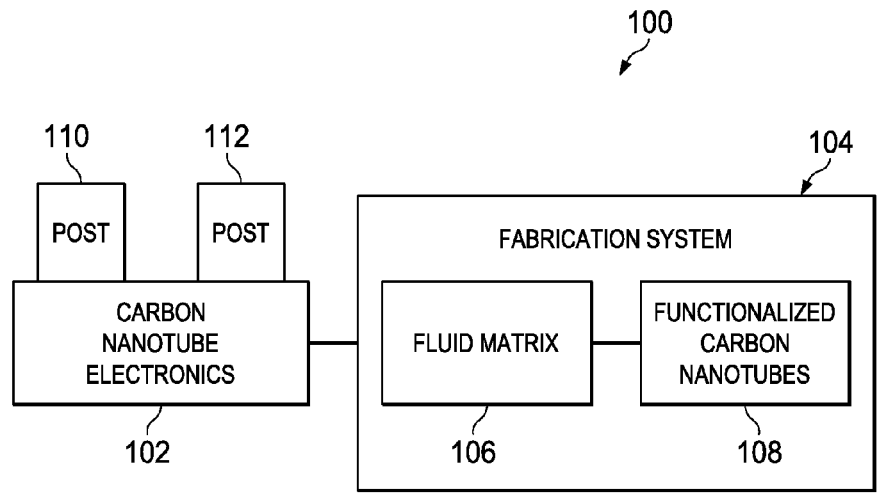
FIG. 1 is a carbon nanotube electronics assembly environment depicted in accordance with an advantageous embodiment.

With reference now to FIG. 1, carbon nanotube assembly environment is depicted in accordance with an advantageous embodiment. Carbon nanotube assembly environment 100 is an exemplary environment in which carbon nanotube electronics 102 may be fabricated. In these examples, Fabrication system 104 is used to fabricate carbon nanotube electronics 102.

In the illustrative example fabrication system 104 comprises fluid matrix 106 and functionalized carbon nanotubes 108. Fluid matrix 106 is a matrix capable of suspending functionalized carbon nanotubes 108 in solution, without dissolving functionalized carbon nanotubes 108. Fluid matrix 106 acts as a carrier system for delivering and suspending functionalized carbon nanotubes 108 during assembly of carbon nanotube electronics 102. In one advantageous embodiment, fluid matrix 106 is an aqueous solution.

Functionalized carbon nanotubes 108 are carbon nanotubes having functional groups attached thereto. Carbon nanotubes are cylindrically structured carbon allotropes composed entirely of $sp^2$-hybridized bonding between carbon atoms. Functionalized carbon nanotubes 108 are formed by exposing carbon nanotubes to a source of functional groups under favorable reaction conditions.

Due to the available bond sites on the carbon atoms along the end of a nanotube, or due to the increased energy of the carbon bonds when stretched under curvature in two dimensions, functional groups preferentially adhere to distal ends of the carbon nanotube. The relative concentration of functional groups at the distal ends of functionalized carbon nanotubes 108 creates a concentration of electrical charges.

Carbon nanotube electronics 102 is a chip, circuit board, or other electronic device that includes circuits, pathways, or electrical connections formed from carbon nanotubes. Carbon nanotube electronics 102 includes posts 110 and 112. Posts 110 and 112 are points on carbon nanotube electronics 102 that are to be connected by a carbon nanotube. Posts 110 and 112 are fabricated such that the centers of the two posts are located at a predetermined distance from one another.

The lengths and chiralities of functionalized carbon nanotubes 108 are preselected. The length of functionalized carbon nanotubes 108 matches the predetermined distance between the centers of posts of posts 110 and 112. The chirality of the functionalized carbon nanotubes is selected to impart desired electrical properties to carbon nanotube electronics 102.

Carbon nanotube electronics 102 is exposed to fluid matrix 106. Upon exposure, an end of the functionalized carbon nanotubes 108 preferentially adheres to the plurality of posts rather than the remainder of the substrate. A connection between posts of the at least one plurality of posts is induced by adhering a second end of the functionalized carbon nanotube to a second one of the at least one plurality of posts.

The illustration of carbon nanotube assembly environment 100 in FIG. 1 is not meant to imply physical or architectural limitations to the manner in which different advantageous embodiments may be implemented. Other components in addition to, and/or in place of, the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 2:
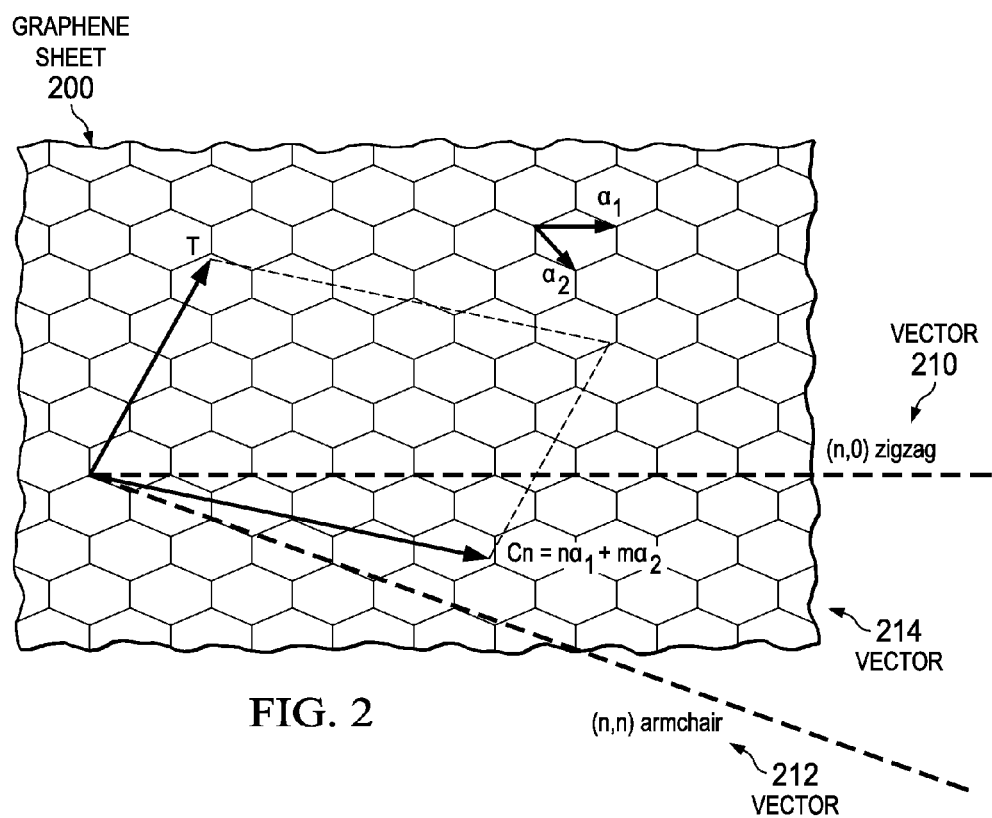
FIG. 2 is a graphene sheet depicting several vectors along which a single walled carbon nanotube can be created in accordance with an advantageous embodiment.

Referring now to FIG. 2, a graphene sheet is shown depicting several vectors along which a single walled carbon nanotube can be created, according to an advantageous embodiment. Graphene sheet 200 is conceptually an unrolled single walled carbon nanotube showing the various chiralities that can be formed.

Carbon nanotubes are cylindrically structured carbon allotropes composed entirely of $sp^2$-hybridized bonding between carbon atoms. A single walled carbon nanotube is conceptually a one-atom-thick layer of graphene wrapped into a seamless cylinder. The chirality of the wrapped graphene sheet is wrapped in the chiral vector, denoted by a pair of indices (n, m). The integers n and m denote the number of unit vectors along two directions in the honeycomb crystal lattice of graphene. The values of n and m determine the chirality, or "twist" of the nanotube. The chirality, in turn, affects the conductance of the nanotube, its density, its lattice structure, and other properties.

Vector 210 is represented by an indices of (n, 0). Vectors having an "m" value equal to zero (0) are said to have a "zigzag" pattern that is non-chiral. Vector 212 is represented by an indices of (n, n), that is, the "n" and "m" values are equal. Vector 212 having an "n" value equal to the "m" is said to have an "armchair" pattern that is non-chiral. Vector 214 is represented by an indices of (n, m), wherein the "n" and "m" values are not equal.

The different chiral structures of carbon nanotubes strongly affect the electrical properties of the nanotube. For a given (n, m) nanotube, if n=m, that is, the carbon nanotube has an "armchair" chirality, the carbon nanotube is conducting. If n–m is a multiple of three, then the nanotube is semiconducting with zero band gap such that the nanotube is considered semi-metallic. Otherwise, the nanotube is a moderate semiconductor. The band gap of a semiconducting carbon nanotube is determined uniquely by the chiral indices (n, m).

Figure 3:
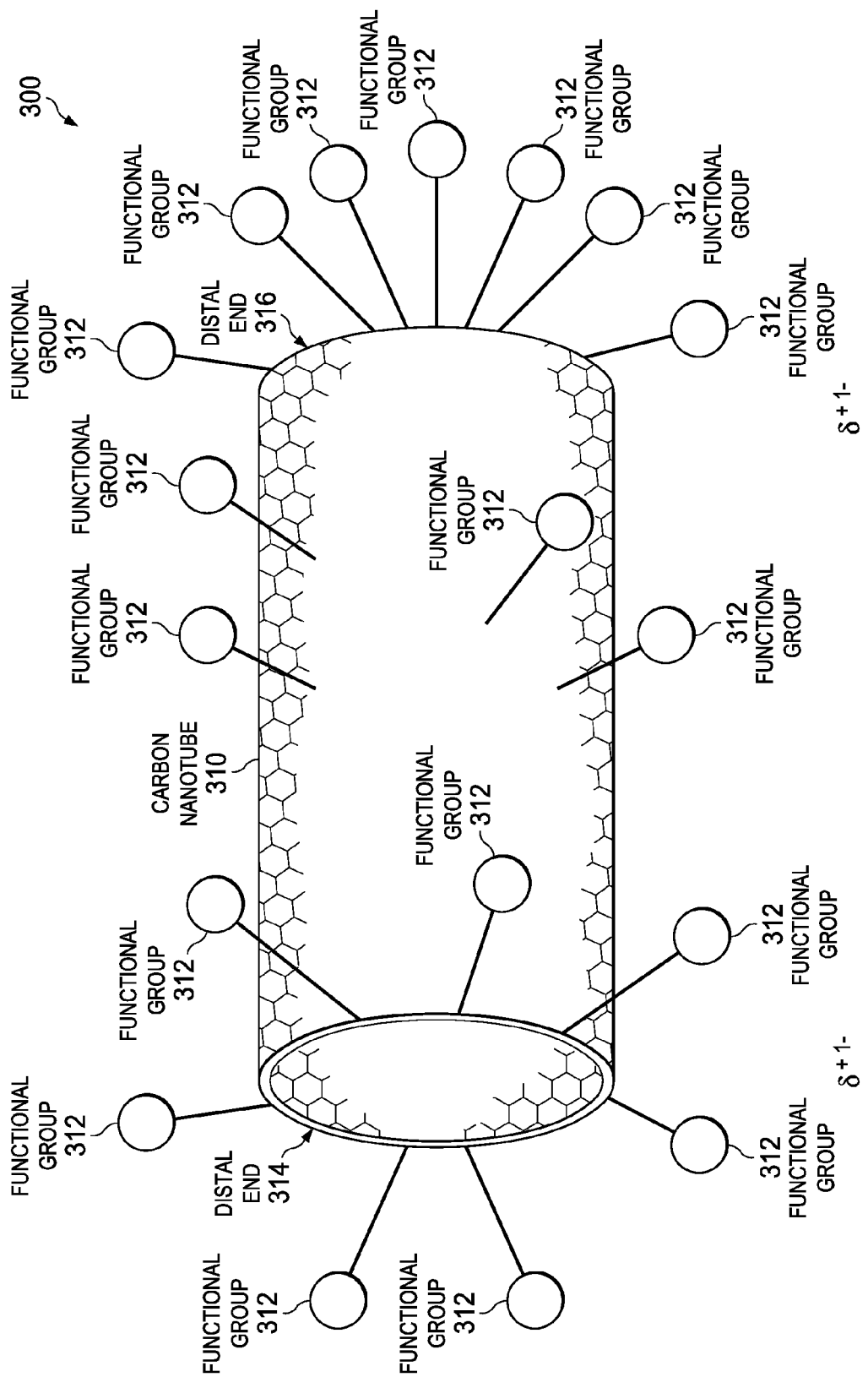
FIG. 3 is a carbon nanotube that has been exposed to a fluid containing functional groups in accordance with an advantageous embodiment.

Referring now to FIG. 3, a carbon nanotube that has been exposed to a fluid containing functional groups is shown in accordance with an advantageous embodiment. Carbon nanotube 310 is a carbon nanotube having a chirality such described in FIG. 2.

Functional groups 312 preferentially attract to, and concentrate at, the distal ends of carbon nanotube 310. Functional groups 312 are chemical functional groups capable of adhering to the surface and ends of carbon nanotube 310. In one advantageous embodiment, functional groups 312 are carboxylic acid functional groups.

Due to the available bond sites on the carbon atoms along the end of a nanotube, or due to the increased energy of the carbon bonds when stretched under curvature in two dimensions, functional groups 312 preferentially adhere to distal ends 314 and 316 of carbon nanotube 310. The relative concentration of functional groups at distal ends 314 and 316 of carbon nanotube 310 creates a concentration of electrical charges.

Carbon nanotube 310 is pictured with "open" ends. Nanotubes with open ends will experience functionalization preferentially along their ends, due to the available bond sites at the carbons along the edge.

While not shown, Carbon nanotube 310 may also be a "capped" nanotube. A capped nanotube will experience functionalization preferentially along its end caps, due to the increased energy due to the curvature in two dimensions.

Distal ends 314 and 316 therefore exhibit a relative charge different from that of the middle of carbon nanotube 310. Depending on what specific functional group is adhered to distal ends 314 and 316, this relative charge can be either a partial delta negative charge or a partial delta positive charge. Other reasons that the functionalized groups cause preferential attachment of the nanotubes besides the charge imbalance include, for example, but are not limited to polarity of functional group, hydrogen bonding, and modification of Van der Waals forces.

Figure 4:
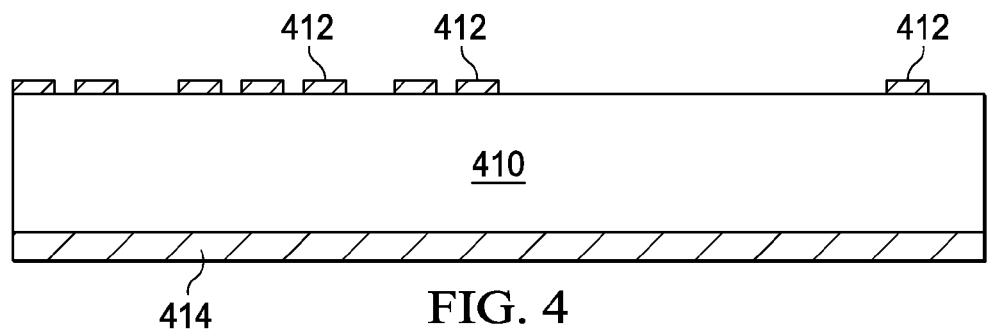
FIG. 4 is a fabrication technique of a printed circuit board in accordance with an advantageous embodiment.
Figure 5:
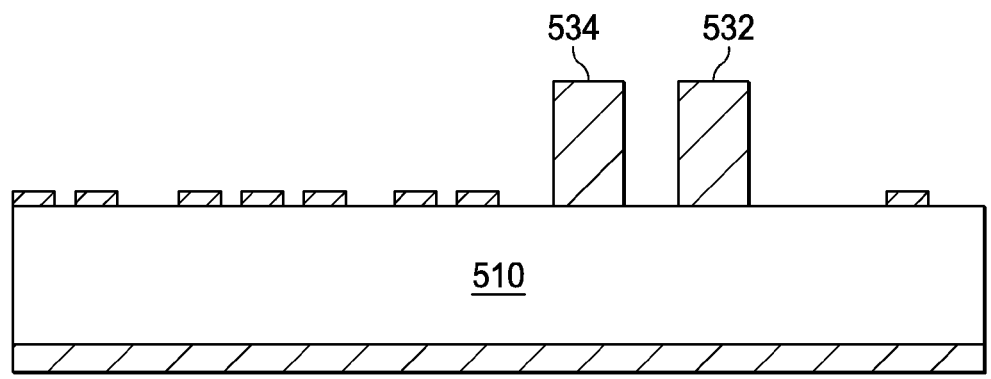
FIG. 5 is a fabrication technique of a printed circuit board in accordance with an advantageous embodiment.
Figure 6:
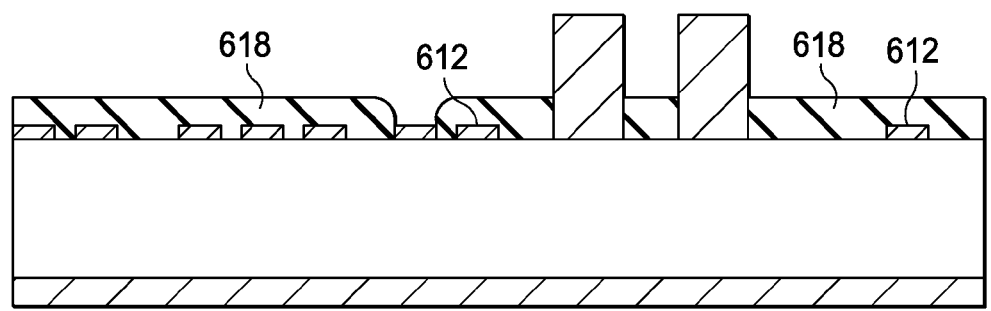
FIG. 6 is a fabrication technique of a printed circuit board in accordance with an advantageous embodiment.

FIGS. 4-6 depict the fabrication of a printed circuit board according to an advantageous embodiment.

Referring now to FIG. 4, there is shown an electrically insulating substrate 410. Electrically insulating substrate 410 is a base or supporting material to which additional layers or materials are applied. Electrically insulating substrate 410 is, for example, but not limited to, an epoxy substrate.

In these examples, signal-wiring conductors 412 and 414 can be selectively deposited into a connection pattern by a dry-film dielectric with laser via process on selected surface portions of electrically insulating substrate 410, signal wiring conductors 412 and 414 are an electrically conductive material. This material may be, for example, but not limited to, copper, molybdenum, and tungsten. Each of the layers 412 and 414 has a weight of, for example, about 0.5 ounces and a thickness of, for example, about 18 micrometers.

Signal wiring conductors 412 and 414 can be patterned by direct selective deposition, selective etching, or other suitable techniques. Signal wiring conductor 414 on the other side can be utilized as a power supply layer. However, it should be clear to those skilled in the art, that signal wiring conductor 414 can also be patterned and segmented into a power mesh with signal pads distributed within the power mesh, but not necessarily connected to the power mesh.

As shown in FIG. 5, post 532 and post 534 are formed on substrate 510 at a location where a connection is to be established. Post 532 and post 534 are fabricated at a predetermined distance from one another that matches a known length of a carbon nanotube that will be utilized to span the distance between post 532 and post 534. The coupled carbon nanotube can form useful circuits when the substrate is designed with knowledge of nanotube length and desired electrical properties (chiralities).

While post 532 and post 534 are shown as being formed early in the fabrication process, it is appreciated that post 532 and post 534 can be similarly fabricated at other points during fabrication of a printed circuit board. Post 532 and post 534 can be formed, for example, but not limited to, prior to deposition of any signal wiring connectors, after deposition of signal wiring connectors, and at any other point during the build up of various layers of the printed circuit boards.

Next, in FIG. 6, layer 618 of electrically insulating material, preferably a layer of photosensitive resin, is applied to cover the signal-wiring conductors 612 in the first wiring layer, and the photosensitive resin is then exposed and developed. The photosensitive resin can be a negative type photosensitive epoxy resin applied to the surface of the substrate by curtain coating, and then precured. The photosensitive resin is then developed with a developer. This developer may be, for example, a mixture of propylene carbonate, cyclohexanone, and gamma-butyrolactone.

After being developed, the surface of the epoxy resin layer 618 is roughened by etching with a solution of potassium permanganate, and is then activated with a seeding chemical. This seeding chemical is a solution including colloidal tin and palladium in this illustrative example.

It is appreciated that signal wiring conductors 612 can be patterned by other methods known in the art, such as for example, by a dry-film dielectric with laser via process by selective etching to form a second wiring layer or wiring level which includes signal wiring conductors 612. Additional layers may be added to one or both sides of the circuit board in subsequent steps not shown here.

Figure 7:
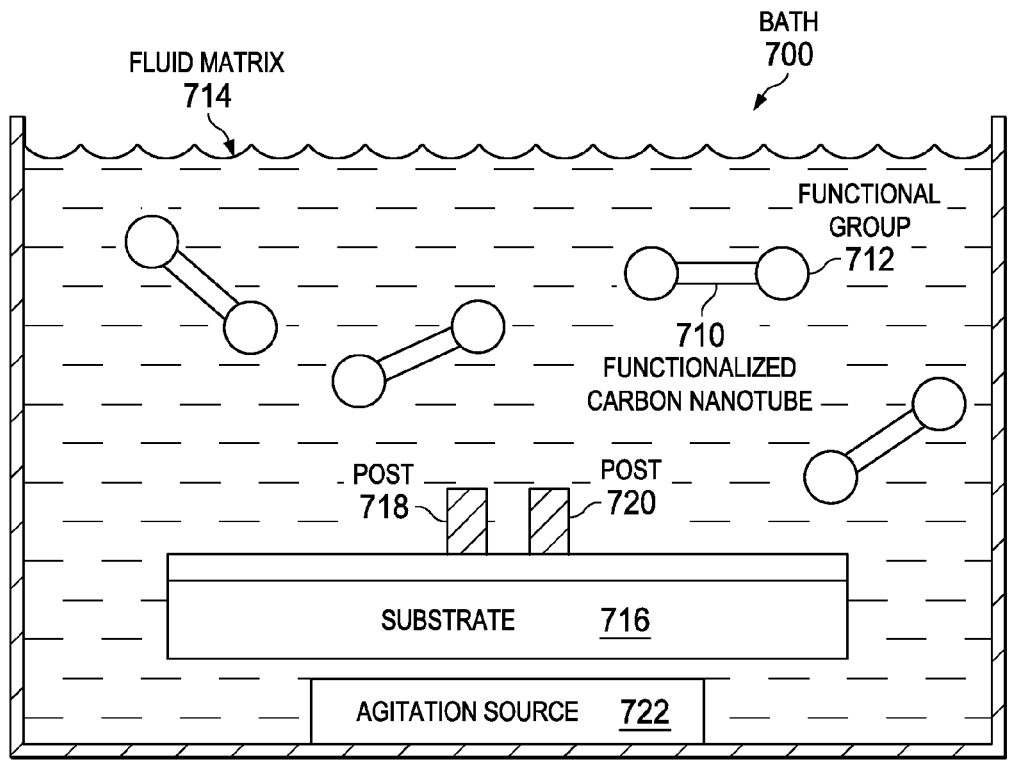
FIG. 7 is a functionalized carbon nanotube bath for creating pathways in accordance with an advantageous embodiment.

Referring now to FIG. 7, a functionalized carbon nanotube bath for creating pathways is shown in accordance with an advantageous embodiment. Bath 700 contains functionalized carbon nanotubes 710 which can be carbon nanotube 310 of FIG. 3. Substrate 716 can be a printed circuit board, such as the electrically insulating substrate 510 of FIG. 5 that is formed into a printed circuit board as described in relation to FIG. 7.

Functionalized carbon nanotubes 710 are suspended in fluid matrix 714. Functionalized carbon nanotubes 710 have been filtered or otherwise segregated such that each of functionalized carbon nanotubes 710 have similar chiralities and lengths. In one advantageous embodiment, each of functionalized carbon nanotubes 710 is narrowly dispersed around a given length, such as, but not limited to 80+/−1 nanometers, 100+/−1 nanometers, and 120+/−1 nanometers. In one advantageous embodiment, each of functionalized carbon nanotubes 710 have similar chiral vectors (or non-chiral vectors), such that each of functionalized carbon nanotubes 710 within fluid matrix 714 have similar or identical indices (n, m).

It is appreciated that functional groups 712, attached to functionalized carbon nanotubes 710, may be present along the shaft of functionalized carbon nanotubes 710 in addition to the shown locations at distal ends of the functionalized carbon nanotubes 710. However, as shown in FIG. 3 above, functional groups 712 preferentially adhere to distal ends of functionalized carbon nanotubes 710. The relative concentration of functional groups at distal ends of functionalized carbon nanotubes 710 creates a relative charge at each of the distal ends of functionalized carbon nanotubes 710.

Bath 700 also contains fluid matrix 714. Fluid matrix 714 is a matrix capable of suspending functionalized carbon nanotubes 710 in solution, without dissolving functionalized carbon nanotubes 710. In one advantageous embodiment, fluid matrix 714 is an aqueous solution.

Substrate 716 is submerged in fluid matrix 714. Substrate 716 includes post 718 and post 720. Post 718 and post 720 are fabricated on substrate 716 such that the linear distance between the center of post 718 and the center of post 720 matches the known length of functionalized carbon nanotubes 710. Thus, in one advantageous embodiment, the linear distance between the center of post 718 and the center of post 720 can be one of 80+/−1 nanometers, 100+/−1 nanometers, and 120+/−1 nanometers.

In one advantageous embodiment, post 718 and post 720 are functionalized prior to immersion in fluid matrix 714.

Functional groups 712 of functionalized carbon nanotubes 710 preferentially adhere to post 718 and post 720 rather than the remainder of substrate 716. Because the functionalized carbon nanotubes 710 have previously been filtered according to a desired size, functionalized carbon nanotubes 710 will energetically prefer to attach themselves in a manner that spans the linear distance between post 718 and post 720, thus creating an electrical pathway along functionalized carbon nanotubes 710.

Bath 700 also contains, or is functionally coupled to, agitation source 722. Agitation source 722 is a source of disturbance to bath 700. Once substrate 716 is submerged within bath 700, agitation source 722 provides gentle agitation to fluid matrix 714.

The agitation of fluid matrix 714 provides the motion and energy required to remove nanotubes that may have adhered to post 718 or post 720 along the shaft rather than at functional groups 712 of functionalized carbon nanotubes 710. The agitation of fluid matrix 714 further provides the necessary turbulence to impart motion to distal ends of functionalized carbon nanotubes 710 that have adhered to one of, but not yet the other of, post 718 and post 720.

Motion of the ends distal from an attached end of functionalized carbon nanotubes 710 allows the distal end the opportunity to adhere to posts that are located at the predetermined linear distance.

Figure 8:
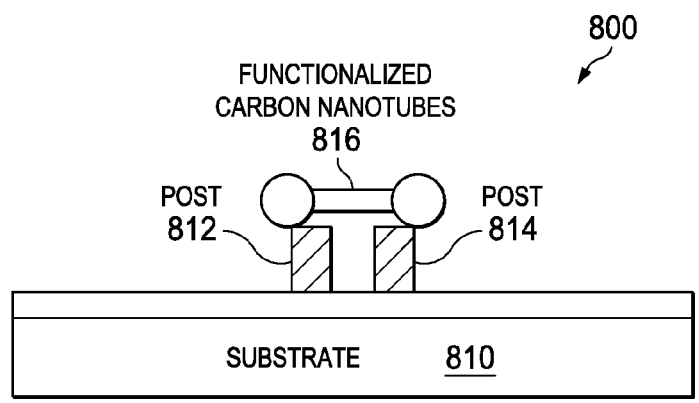
FIG. 8 is a completed circuit having a carbon nanotube pathway in accordance with an advantageous embodiment.

Referring now to FIG. 8, a completed circuit having a carbon nanotube pathway is shown according to an advantageous embodiment. Circuit 800 is a circuit formed from the preferential adherence of a functionalized carbon nanotube to posts within a bath, such as bath 700 of FIG. 7.

Substrate 810 can be a printed circuit board, such as the electrically insulating substrate 716 of FIG. 7 that is formed into a printed circuit board as described in relation to FIG. 7. Substrate 810 includes post 812 and post 814. Functionalized carbon nanotubes 816 spans the linear distance between post 812 and post 814.

The self-assembly of circuit 800 results in functionalized carbon nanotubes 816 being anchored to both post 812 and post 814. Thus, the coupled carbon nanotube can form useful circuits when the substrate is designed with knowledge of nanotube length and desired electrical properties as determined by the chirality of the coupled carbon nanotubes.

After removing the substrate from the bath, the substrate can be annealed to remove functionalization from functionalized carbon nanotubes 816, as well as any functionalization on post 812 and post 814. Annealing may also enhance electrical connections between posts 812 and 814 to adhered carbon nanotubes.

In one advantageous embodiment, circuit 800 can be coated with a thin layer of electrically insulating material. The insulating material also serves to hold functionalized carbon nanotubes 816 in place between post 812 and post 814. Annealing may remove the functionalization that caused the preferential adhesion. Therefore, the thin layer of electrically insulating material may be needed to preserve the physical connections between functionalized carbon nanotubes 816 and post 812, and functionalized carbon nanotubes 816 and post 814.

Figure 9:
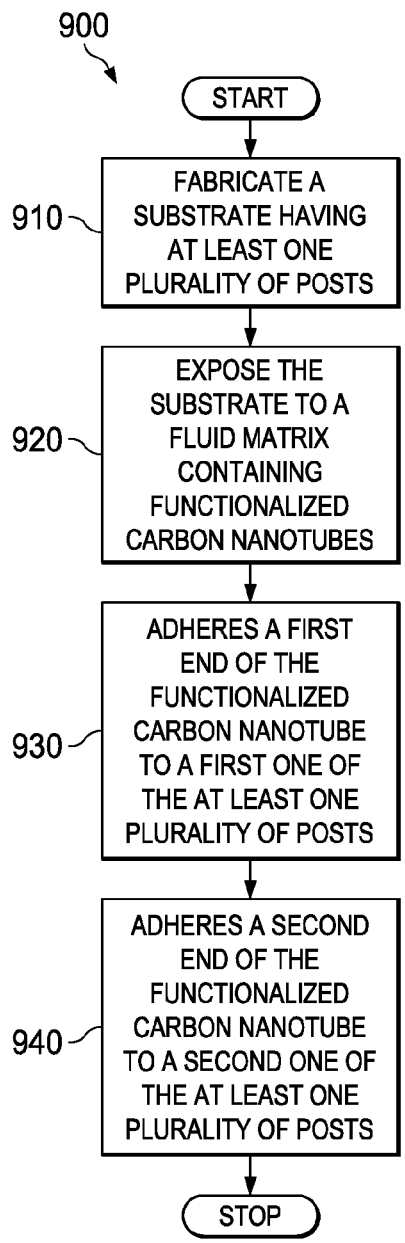
FIG. 9 is a flowchart of a method for assembling carbon nanotube electronics in accordance with an advantageous embodiment.

Referring now to FIG. 9, a flowchart of a method for assembling carbon nanotube electronics is shown in accordance with an advantageous embodiment.

Process 900 begins by providing a substrate having at least one plurality of posts (step 910). The at least one plurality of posts are fabricated such that the center of the posts are located at a predetermined distance from one another. The predetermined distance is chosen to match the known length of a functionalized carbon nanotube that will be used to span between the two posts.

Process 900 then exposes the substrate to a fluid matrix containing functionalized carbon nanotubes (step 920). The fluid matrix can be an aqueous bath or other liquid capable of suspending the functionalized carbon nanotubes. The functionalized carbon nanotubes within the fluid matrix have been presorted based on both the chirality and the length of the functionalized carbon nanotubes. The chirality of the functionalized carbon nanotubes is chosen to impart desired electrical properties to the carbon nanotube electronics. The length of the functionalized carbon nanotubes is chosen to match the predetermined distance between the two posts of the substrate.

Process 900 then adheres a first end of the functionalized carbon nanotube to a first one of the at least one plurality of posts (step 930). The first end of the nanotube is either distal end of the carbon nanotube having a relatively higher concentration of functional groups than does the shaft of the carbon nanotube. Due to the relative charge of the distal end, the functionalized carbon nanotubes will self assemble to the posts.

Process 900 then adheres a second end of the functionalized carbon nanotube to a second one of the at least one plurality of posts (step 940), with the process terminating thereafter. Because each of the functionalized carbon nanotubes within the fluid matrix have the desired chirality and length, the functionalized carbon nanotube will form a pathway between the two posts. The pathway will have the desired electrical properties based on the chirality of the functionalized carbon nanotube.

Figure 10:
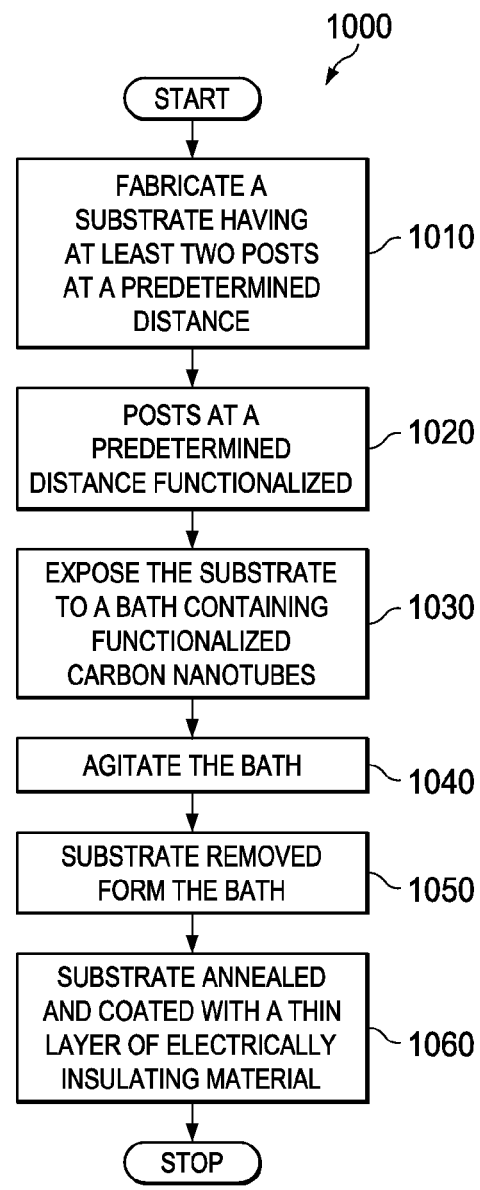
FIG. 10 is a flowchart of the processing steps for the self-assembly of a carbon nanotube electronic circuit in accordance with an advantageous embodiment.

Referring now to FIG. 10, a flowchart of the processing steps for the self-assembly of a carbon nanotube electronic circuit is shown according to an advantageous embodiment. Process 1000 is a physical process that occurs within a bath, such as bath 700 of FIG. 7.

Process 1000 begins by providing a substrate having at least two posts at a predetermined distance (step 1010). The substrate can be substrate 716 of FIG. 7, and can be fabricated according to a method similar to that described with regard to FIG. 7. The at least two posts at a predetermined distance are fabricated on the substrate at a predetermined distance chosen to match the length of carbon nanotubes that will be used to span the predetermined distance between the centers of the two posts.

Optionally, the at least two posts at a predetermined distance can be functionalized (step 1020). Functionalization of the posts may enhance the affinity of nanotube ends to adhere to the posts.

Process 1000 continues by exposing the substrate to a bath containing functionalized carbon nanotubes (step 1030). The bath can be bath 700 of FIG. 7. The functionalized carbon nanotubes can be carbon nanotube 310 of FIG. 3. The functionalized carbon nanotubes in the bath have been filtered or otherwise segregated such that each of the functionalized carbon nanotubes has similar chiralities and lengths. In one advantageous embodiment, each of the functionalized carbon nanotubes is narrowly dispersed around a given length, such as, but not limited to 80+/−1 nanometers, 100+/−1 nanometers, and 120+/−1 nanometers. In one advantageous embodiment, each of the functionalized carbon nanotubes have similar chiral vectors (or non-chiral vectors), such that each of the functionalized carbon nanotubes within the bath have similar or identical indices (n, m).

The functional groups of the functionalized carbon nanotubes preferentially adhere to posts of the submerged substrate, rather than the remainder of substrate. Because the functionalized carbon nanotubes have previously been filtered according to a desired size, functionalized carbon nanotubes will energetically prefer to attach themselves in a manner that spans the linear distance between adjacent posts separated by the predetermined distance, thus creating an electrical pathway along the functionalized carbon nanotube.

Process 1000 continues by agitating the bath (step 1040). Agitation of the bath provides the motion and energy required to remove nanotubes that may have adhered to post 718 or post 720 of FIG. 7 along the nanotube shaft rather than at the distal ends of the functionalized carbon nanotubes. The agitation of fluid matrix further provides the necessary turbulence to impart motion to distal ends of functionalized carbon nanotubes that have adhered to one of, but not yet the other of, adjacent posts separated by the predetermined distance. Motion of the ends distal from an attached end of functionalized carbon nanotubes allows the distal end the opportunity to adhere to posts that are located at the predetermined linear distance.

The substrate is then removed from the bath (step 1050). The self-assembly of the circuit results in functionalized carbon nanotubes being anchored to adjacent posts separated by the predetermined distance. Thus, the coupled carbon nanotube can form useful circuits when the substrate is designed with knowledge of nanotube length and desired electrical properties, as determined by the chirality of the functionalized carbon nanotube.

Optionally, after removing the substrate from the bath, the substrate can be annealed and coated with a thin layer of electrically insulating material (step 1060). Annealing the substrate can remove functionalization from functionalized carbon nanotubes, as well as any functionalization on posts. Annealing may also enhance electrical connections between posts to the adhered carbon nanotubes. The insulating material also serves to hold the functionalized carbon nanotubes in place between the posts. Because annealing may remove the functionalization that caused the preferential adhesion, the thin layer of electrically insulating material may be needed to preserve the physical connections between functionalized carbon nanotubes and the posts.

The advantageous embodiments provide a method and system for production of nanotube-enabled circuits that do not rely on manual positioning of the nanotubes. Carbon nanotubes self-assemble on a metal-templated surface to form electrical connections including semiconducting connections that define a circuit.

A fabricated substrate has at least one plurality of posts. The plurality is fabricated such that the two posts are located at a predetermined distance from one another.

The substrate is exposed to a fluid matrix containing functionalized carbon nanotubes. The functionalized carbon nanotubes preferentially adhere to the plurality of posts rather than the remainder of the substrate. A connection between posts of the at least one plurality of posts is induced by adhering a second end of the functionalized carbon nanotube to a second one of the at least one plurality of posts.

The lengths and chiralities of the functionalized carbon nanotubes are preselected. The length of the functionalized carbon nanotubes matches the predetermined distance between the centers of posts of the plurality of posts. The chirality of the functionalized carbon nanotubes is selected to impart the desired electrical properties to the created circuit.

Advantageous embodiments herein provide a system for production level manufacturing of nanotube-enabled circuits that do not rely on manual positioning of the nanotubes. Producing carbon nanotube electronics according to the disclosed method can substantially decrease production time and costs associated with the manufacture of carbon nanotube electronics, resulting in the feasibility of production scale manufacturing of carbon nanotube-based electronics.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A system for assembling carbon nanotube electronics, the system comprising:
    a substrate, wherein the substrate has at least one plurality of posts, the at least one plurality of posts being fabricated at a predetermined distance from one another;
    a fluid matrix containing functionalized carbon nanotubes, wherein the functionalized carbon nanotubes comprise a first end, a middle, and a second end, wherein the first end and the second end have a relative concentration of functional groups different from that of the middle such that the functionalized carbon nanotubes exhibit relative electrical charges at the first end and the second end;
    an agitation source, wherein providing agitation of the fluid matrix to preferentially adhere the first end of a functionalized carbon nanotube to a first one of the at least one plurality of posts and adheres the second end of the functionalized carbon nanotube to a second one of the at least one plurality of posts due to the relative electrical charges at the first end and the second end, wherein a connection is formed between the first one and the second one of the at least one plurality of posts.

2. The system of claim 1 further comprising:
    the fluid matrix containing the functionalized carbon nanotubes, wherein the fluid matrix contains the functionalized carbon nanotubes having similar lengths and similar chiralities.

3. The system of claim 2, wherein the similar lengths of the functionalized carbon nanotubes are selected to correspond to the predetermined distance between the first one and the second one of the at least one plurality of posts.

4. The system of claim 2, wherein the similar lengths of the functionalized carbon nanotubes are selected from the group consisting of 80+/−1 nanometers, 100+/−1 nanometers, and 120+/−1 nanometers.

5. The system of claim 1, wherein the similar chiralities of the functionalized carbon nanotubes are selected based on desired electrical properties of the functionalized carbon nanotubes.

6. The system of claim 5, wherein the desired electrical properties of the functionalized carbon nanotubes is a conductance of the functionalized carbon nanotubes.

7. The system of claim 5, wherein each of the functionalized carbon nanotubes have similar or identical chiral vectors.

8. The system of claim 1, wherein the fluid matrix is an aqueous matrix.

9. The system of claim 1 further comprising:
    the agitation source, wherein the agitation source agitates the fluid matrix to induce removal of functionalized carbon nanotubes that may have adhered to the first one and the second one of the at least one plurality of posts along a shaft of the functionalized carbon nanotubes.

10. The system of claim 1 further comprising:
    the agitation source, wherein the agitation source agitates the fluid matrix to impart motion to distal ends of functionalized carbon nanotubes that have adhered to one of, but not yet the other of, the first one and the second one of the at least one plurality of posts.

11. The system of claim 1, wherein the functionalized carbon nanotubes comprise carboxylic acid functional groups.

12. The system of claim 1 further comprising:
    a heat source, wherein the heat source anneals the substrate to remove functional groups from the functionalized carbon nanotubes.

13. The system of claim 12 further comprising:
    the heat source, wherein the heat source anneals the substrate to remove functional groups from the first one and the second one of the at least one plurality of posts.

14. The system of claim 1 further comprising:
    an electrically insulating material, wherein the electrically insulating material comprises a coating applied to the substrate.

15. The system of claim 13, wherein the electrically insulating material comprises a layer of photosensitive resin applied to cover the connection formed between the first one and the second one of the at least one plurality of posts.

16. The system of claim 1, wherein the substrate is a printed circuit board.

17. The system of claim 1, wherein the functionalized carbon nanotubes are selected from the group consisting of open ended carbon nanotubes and capped carbon nanotubes.

18. The system of claim 1, wherein the first one and the second one of the at least one plurality of posts are functionalized prior to immersion in the fluid matrix.

19. The system of claim 1, wherein the connection formed by the functionalized carbon nanotube spans a linear distance between the first one and the second one of the at least one plurality of posts.

* * * * *